343-700 MS AU 256 EX
XR 3,778,717

United States Patent [19]

Okoshi et al.

[11] 3,778,717

[45] Dec. 11, 1973

[54] SOLID-STATE OSCILLATOR HAVING SUCH A STRUCTURE THAT AN OSCILLATING ELEMENT, A RESONATOR AND A RADIATOR OF ELECTROMAGNETIC WAVES ARE UNIFIED IN ONE BODY

[75] Inventors: Takanori Okoshi, Tokyo; Masatoshi Migitaka, Kokubunji, both of Japan

[73] Assignee: Hitachi, Ltd., Tokyo, Japan

[22] Filed: Apr. 27, 1972

[21] Appl. No.: 248,163

[30] Foreign Application Priority Data

Apr. 30, 1971 Japan .......................... 46/27975

[52] U.S. Cl. ............ 325/105, 325/180, ~~331/107 G~~, 331/108 C, 331/108 D, 343/767, 343/772, 343/775

[51] Int. Cl. .............................................. H04b 1/04

[58] Field of Search .................... 325/105, 157, 180; 331/107 G, 108 C, 108 D; 334/84 M; 343/767, 772, 775, 779

[56] References Cited

UNITED STATES PATENTS

| | | | |
|---|---|---|---|
| 3,639,857 | 2/1972 | Okoshi et al. | 333/84 M |
| 3,621,306 | 11/1971 | Schickle | 331/107 G |
| 3,435,303 | 3/1969 | Braslau | 331/107 G |
| 3,629,724 | 12/1971 | Shiga | 331/108 C |

*Primary Examiner*—Albert J. Mayer
*Attorney*—Paul M. Craig et al.

[57] ABSTRACT

A solid-state oscillator for radiating electromagnetic waves in the frequency range from microwave to millimeter wave including solid-state oscillating element, a planar resonator, a high frequency choke, a bias terminal and a substrate which are unified in one body, and including a small slit in the planar resonator for radiating electromagnetic waves.

11 Claims, 7 Drawing Figures

SOLID-STATE OSCILLATOR HAVING SUCH A STRUCTURE THAT AN OSCILLATING ELEMENT, A RESONATOR AND A RADIATOR OF ELECTROMAGNETIC WAVES ARE UNIFIED IN ONE BODY

BACKGROUND OF THE INVENTION

1. Field of the Invention

The present invention relates to oscillators including a solid-state oscillating element such as a Funn diode, IMPATT diode, an Esaki diode or the like, and particularly relates to an oscillator comprising an oscillating element, a resonator and a radiator integrated or unified into one body.

2. Description of the Prior Art

It has been recognized that, for radiating electromagnetic waves in the frequency range from microwaves to millimeter waves, a solid-state oscillator is superior to a vacuum tube oscillator because the former is smaller in size and is longer in service life than the latter. Therefore, in these days, remarkably various solid-state oscillators have been developed and are being put into practical use. The conventional solid-state oscillators normally have an oscillating element mounted within a cavity reasonator, and may sometimes have an oscillating element coupled with a planar resonator. The resonator so coupled with an oscillating element is then connected with a radiator or a load circuit through an output circuit. Thus, the conventional solid-state oscillators have a complicated circuit construction and become large-sized. Any necessity of match in circuit connection and any possible occurrence of loss in circuit connection lead to complication of the handling of the resulting oscillator and a decrease of the operation efficiency of the oscillator. In addition, use of a cavity resonator requires a readjustment of a resonant circuit after an oscillating element has been mounted into the cavity resonator, which renders the construction of the oscillator more complicated.

SUMMARY OF THE INVENTION

A primary object of the present invention is to provide a solid-state oscillator for radiating electromagnetic waves in the frequency range from microwaves to millimeter waves having a small size, a long service life and a simplified construction.

Another object of the present invention is to provide a solid-state oscillator being easy in handling, encountering very small loss and having the above-mentioned features.

Yet another object of the present invention is to provide a solid-state oscillator readily mountable on an electromagnetic horn or a waveguide so that upon connection of a bias source to the oscillator electromagnetic waves can be radiated in the frequency range from microwaves to millimeter waves.

A further object of the present invention is to provide an arrangement of solid-state oscillators in parallel for radiating a large amount of electromagnetic waves in the frequency range from microwaves to millimeter waves.

Generally, the impedance of a solid-state oscillating element is far lower than that of a vacuum tube, and therefore the solid-state oscillating element is capable of being directly coupled with a planar resonator having a low impedance. The planar resonator having a resonating conductive plate operates with a large amount of high frequency current flowing on the resonating conductive plate due to such a low impedance. Thus, when a small slit is provided through the resonating conductive plate in a particular arrangement, the small slit cuts off a large amount of high frequency current and radiates in the free space electromagnetic waves in the frequency range from microwaves to millimeter waves very efficiently. The length of the small slit may be in the order of one-twentieth wavelength, for resonation Such a small slit has substantially no proper resonator characteristic and is capable of serving as a radiator having a high radiation efficiency and a wide utility for the frequency range. The use of the small slit in the resonating conductor plate facilitates integration or unification of an oscillating element, a resonator and a radiator.

The present invention has been made on the basis of the above-described findings.

According to one aspect of the present invention, a solid-state oscillator for radiating electromagnetic waves in the frequency range from microwaves to millimeter waves comprises:

a solid state oscillating element and an insulating layer, one terminal face of said element and one surface of said insulating layer being joined to a surface of a conductive substrate respectively;

a terminal layer for connecting a bias source, a first conductive layer for preventing a high frequency current generated by said element upon the application of a bias voltage supplied by said bias source from flowing toward said terminal layer and a second conductive layer for forming a planar resonator for said high frequency current in combination with said insulating layer, said terminal layer and said conductive layers being joined to the other surface opposite to said surface of said insulating layer respectively and being connected serially;

a third conductive layer for connecting said second conductive layer with the other terminal face opposite to said terminal face of said element; and a small slit in said second conductive layer for interrupting said high frequency current flowing therein, radiating electromagnetic waves of high frequency and operating as a radiator, thereby said oscillator having a structure such that said oscillating element, said planar resonator, said means for preventing said high frequency current, said terminal, said radiator and said substrate are unified in one body, and being able to radiate said electromagnetic waves by itself. The oscillator of the present invention is, due to the unified or integrated construction, advantageous in that the size is small, the service life is extended, the construction is simplified and the handling is facilitated. Therefore, the oscillator of the present invention can be readily coupled with the free space or an external circuit.

Other objects, features and advantages of the present invention will be apparent from the following description of some preferred embodiments referring to the accompanying drawings.

DESCRIPTION OF THE PREFERRED EMBODIMENTS

Figure 1:
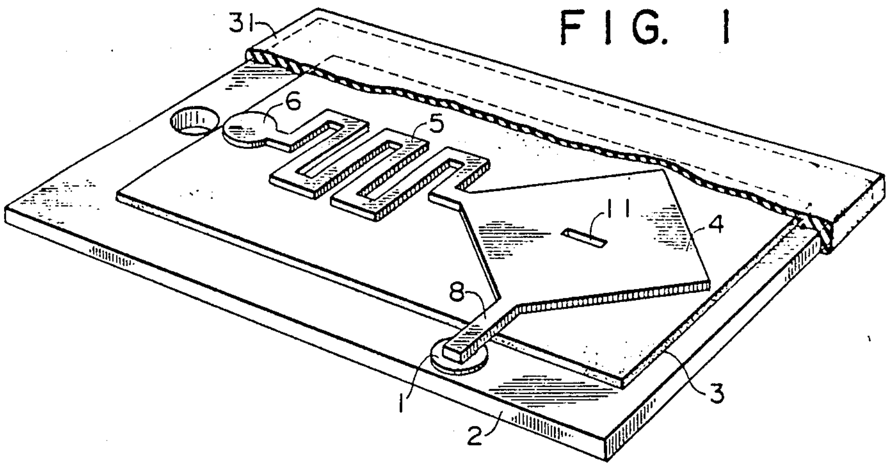
FIG. 1 is a perspective view of a solid-state oscillator embodying the present invention.

Throughout the drawings, similar parts are denoted by the same reference numerals.

Referring first to FIG. 1 showing in a perspective view a preferred embodiment of the present invention, a solid-state oscillating element 1 which may be, for example, a Gunn diode has its one terminal face joined with an electrically conductive substrate 2 which may be, for example, made of copper. Further a thin electrically insulating plate 3 which suffers from little high frequency loss is joined with another part of the conductive substrate 2. The insulating plate 3 may be, for example, made of a styrene copolymer sold under Rexolite (a registered trade mark of American ENKA corporation). Onto the insulating plate 3, a resonating conductive plate 4 is substantially square shape which may be, for example, made of copper, an inductor 5 in a jigzag shape, and a terminal 6 for connection with a bias source are applied in the described order and are interconnected with respectively adjacent elements. The resonating conductive plate 4 constitutes, in cooperating with the insulating plate 3, a planar resonator. One corner of the resonating conductive plate 4 is connected with the other terminal face of the oscillating element 1 through a conductor 8. At the central portion of the resonating plate 4 or in its vicinity, a small slit 11 is provided. The length of the small slit 11 is perpendicular to an orthogonal line connecting the above-mentioned one corner of the resonating plate 4 connected with the oscillating element 1 and the opposing corner.

In operation, the terminal 6 is connected with a bias source and the element 1 starts oscillation with a result that a large amount of high frequency current flows through the resonating conductive plate 4 perpendicularly to the small slit 11 towards the oscillating element 1. Thus, the small slit 11 extending perpendicularly to the direction of the high frequency current flow can radiate a large high frequency power externally. The inductor 5 prevents the current from flowing towards the bias source. If necessary, an insulating film 31 suffering from little high frequency loss such as of a resin may be coated on the resulting oscillator to reinforce the junctions between adjacent elements and to prevent any possible erosion or contamination in an ambient atmosphere.

As can be now understood, the oscillator illustrated in FIG. 1 comprises on a single conductive substrate an oscillating element, a resonator, a radiator and an inductor all integrated into one body. The oscillator in such an integrated or unified structure is capable of being readily mounted on an external circuit and radiating a high frequency electromagnetic wave of a sufficiently high intensity, as will be seen from the following description.

Figures 2, 3:
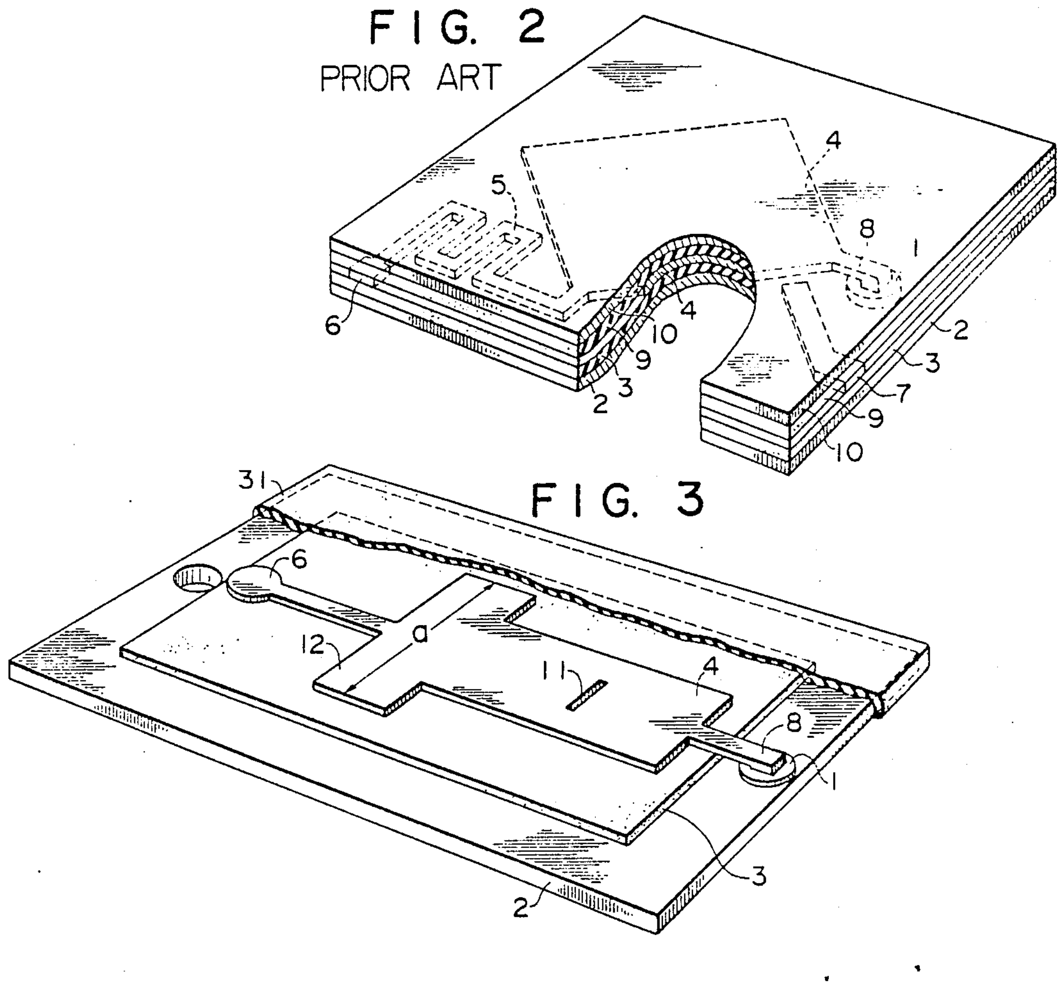
FIG. 2 PRIOR ART, FIG. 3
FIG. 2 is a perspective view of an example of a conventional oscillator comprising various components similar to those of the oscillator shown in FIG. 1.
FIG. 3 is a perspective view of another solid-state oscillator embodying the present invention.

In order to make clearer the advantages offered by the embodiment according to the present invention as shown in FIG. 1, reference is made to FIG. 2 in which an example of a conventional solid-state oscillator in a similar construction, i.e., comprising a planar resonator and inductor is shown in a perspective view. In FIG. 2, a part of the oscillator is cut out to illustrate its layer structure, i.e., the so-called tri-plate structure. One terminal face of an oscillating element 1 is joined with the surface of a conductive substrate 2. A thin insulating layer 3 is applied on the surface of the substrate 2 except on the portion on which the element 1 is disposed. On the surface of the insulating layer 3 are applied a resonating conductive plate 4, an inductor 5, a terminal 6 for connection with a bias source, an output circuit 7 and a conductive member 8 connecting the other terminal face of the oscillating element 1 with the resonating conductive plate 4. Further on these components another insulating layer 9 is provided. On the insulating layer 9 a conductive plate 10 is provided. In the oscillator of the above-mentioned construction, high frequency energy stored in a planar resonator constituted by the resonating plate 4 and the insulating layer 3 is transmitted to an external circuit such as a radiator or a load circuit through the output circuit 7. Thus, in order to derive an oscillation output from the oscillator, an external circuit for leading out the output is indispensable. Thereby, the size of the oscillator becomes large, match adjustment is required when such an external circuit is coupled, and the handling is much complicated. In addition, considerable losses are encountered with the coupling between the resonator and the output circuit 7 and the coupling between the output circuit 7 and an external circuit. It is apparent from the illustration in FIG. 1 that the oscillator of the present invention no longer encounters with such drawbacks.

Referring now to FIG. 3 showing another embodiment of an oscillator of the present invention in a perspective view, a solid-state oscillating element 1 which may be, for example, a Gunn diode has its one terminal face joined with the surface of an electrically conductive substrate 2 which may be, for example, made of copper. An electrically insulating plate 3 is applied on the surface of the substrate 2. The insulating plate may be made of, for example, a styrene copolymer sold under Rexolite (a registered trade mark of American ENKA Corporation). Onto the insulating plate 3, a rectangular resonating conductive plate 4 which may be, for example, made of copper, a choke plate 12 which may be, for example, made of copper, and a terminal 6 for connection with a bias source are applied in the described order and are interconnected with respectively adjacent elements. One side of the rectangular resonating conductive plate 4 is directly coupled with the choke plate 12. The effective length *a* of the choke plate 12 is so selected as to be substantially one-half of the wavelength which a generated high frequency electromagnetic wave shows within the insulating plate 3. Thereby, the choke plate 12 can serve to prevent the generated high frequency current from flowing into the bias source. Another side of the rectangular resonating plate opposing the side directly coupled with the choke plate 12 is connected with the other terminal face of the oscillating element 1. At the central portion of the resonating plate 4 or in its vicinity, a small slit is provided in parallel with the above-mentioned sides. If necessary, an insulating film 31 (which may be a resin) may be coated as in the case of FIG. 1 embodiment.

In operation, the terminal 6 is connected with a bias source and the element 1 starts oscillation with a result that a large amount of high frequency current flows through the resonating plate 4 perpendicularly to the small slit 11, i.e., in the direction parallel with the other two sides of the rectangular resonating plate 4. Thus, the small slit 11 extending perpendicularly to the direction of the high frequency current flow can radiate a large high frequency power to the free space.

As can be seen from the above description, also in FIG. 3 embodiment, the oscillator comprises a high frequency choke plate, a resonator, an oscillating element and a radiator all unified into one body. Thus, the oscillator shown in FIG. 3 is, as the embodiment of FIG. 1, advantageously made small in size, long in service life and simple in construction and handling, and can directly radiate high frequency electromagnetic waves externally.

Clearly, an oscillator of the present invention having the above-mentioned features can be readily mounted on various circuits as the radiation source of an electromagnetic wave.

Hereinafter examples of arrangements in which oscillators are mounted on various circuits will be next described along with their operation and resulting advantages.

Figure 4:
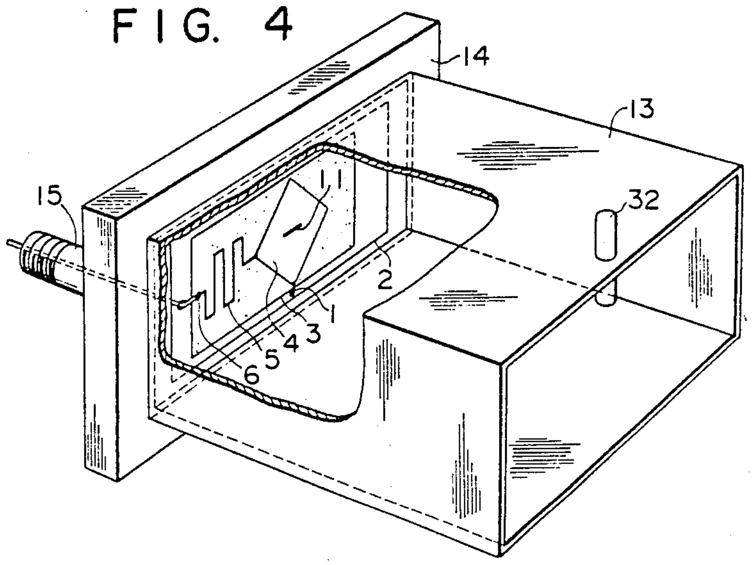
FIG. 4 is a perspective view illustrating how an oscillator is coupled with a waveguide in accordance with the present invention, by breaking away a part of a wall of the waveguide.

Referring to FIG. 4 showing in a perspective view an arrangement in which a waveguide is used for transmitting an electromagnetic wave, an oscillator comprising a solid-state oscillating element 1, a conductive substrate 2, an insulating plate 3, a resonating conductive plate 4 and an inductor 5 as well as a connection terminal all unified in one integral body is joined with an end plate 14 of a waveguide 13, thereby being mounted on the waveguide 13. The joining of the oscillator and the end plate 14 can be easily attained by, for example, fixing the substrate 2 to the end plate 14 with screws inserted into through holes (not shown) formed through the substrate 2 and the end plate 14. The connection terminal is connected with a connector 15 provided to the end plate 14.

In operation, a bias source is connected with the connector 15 and the oscillating element starts oscillation with a result that a high frequency output is radiated directly from the slit 11 and propagates within the waveguide 13. Thus, the oscillator of the present invention can be easily mounted on a waveguide and can be directly coupled with the waveguide without any coupling means such as a loop or post. Further, since the planar resonator has a relatively low quality factor and the slit is not resonant at any particular frequency, the frequency of the radiated and transmitted electromagnetic wave is readily pulled in to a frequency determined by the associated waveguide circuit which latter frequency is adjustable by the post 32 shown. Further, the conductive substrate 2 may be joined with one of side walls of the wave guide 13 to obtain similar functional effects.

Figure 5:
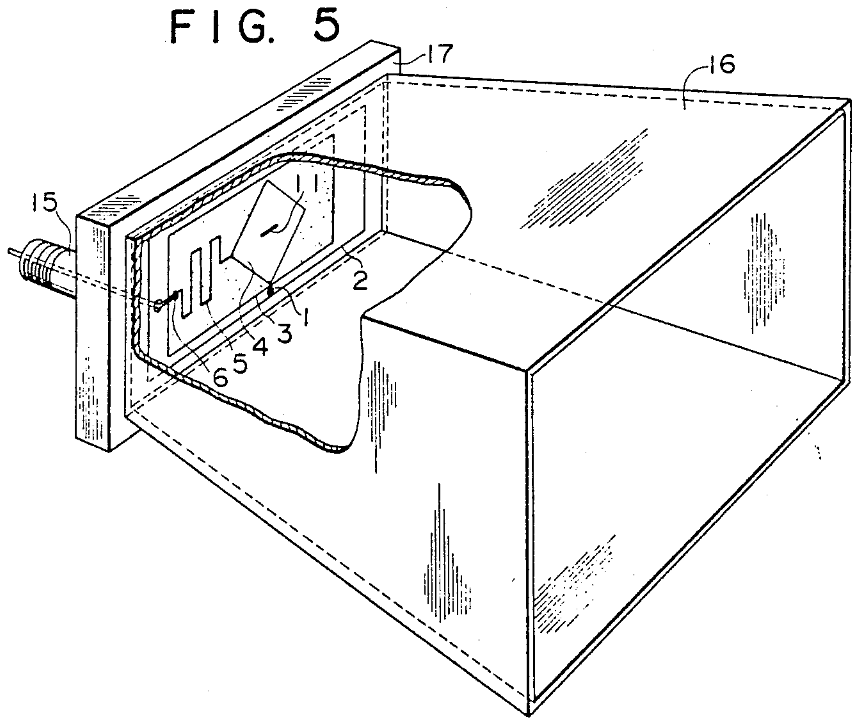
FIG. 5 is a perspective view illustrating how an oscillator is coupled with an electromagnetic horn, by breaking away a part of a wall of the horn.

Referring now to FIG. 5 showing in a perspective view an arrangement in which an electromagnetic wave radiated from a solid-state oscillator is further transmitted to the free space in a particular direction, a solid-state oscillator is mounted to an electromagnetic horn 16 with the substrate 2 of the oscillator joined with an end plate 17. The oscillator shown in FIG. 5 has a construction similar to that of FIG. 1, 3 or 4. In operation, an electromagnetic wave is radiated from the slit 11 with a high radiation intensity in the direction of the electromagnetic horn 16. This arrangement of an oscillator and an electromagnetic horn has a simple construction and a sufficiently large mechanical strength, and is therefore particularly useful for mount on vehicles as a microwave generator to be used to prevent collision of the vehicles.

Figure 6:
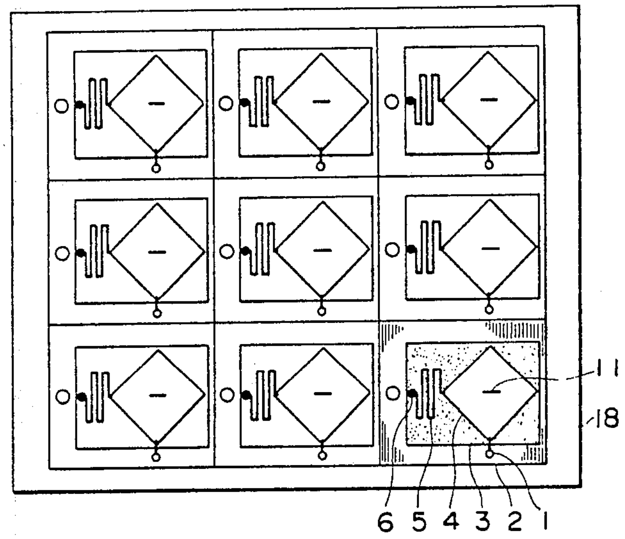
FIG. 6 is a plan view of an example of an arrangement of solid-state oscillators for their parallel operation in accordance with the present invention.

The solid-state oscillators of the present invention may be arranged for parallel operation to obtain a high power radiation of a high frequency electromagnetic wave. FIG. 6 shows in a plan view an embodiment in which a plurality of solid-state oscillators are arranged or assembled in parallel for simultaneous parallel operation. In FIG. 6, a plurality of solid-state oscillators are arranged on and joined with the surface of a support plate 18 in such a manner that they are directed in the same direction and are in conjunction with each other. With this arrangement, the planes of polarization of the electromagnetic waves radiated from the slits 11 are the same.

Figure 7:
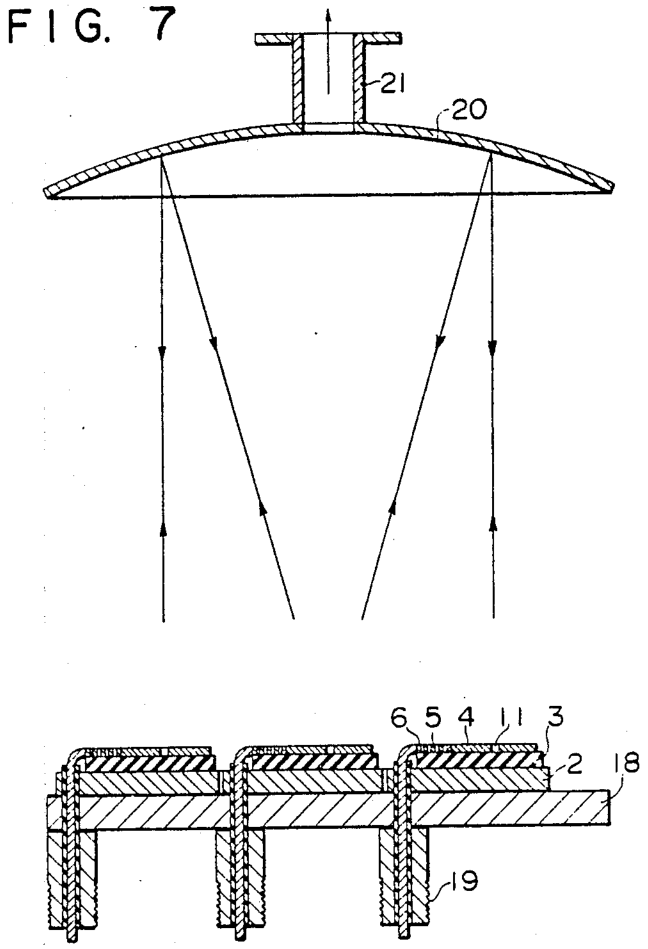
FIG. 7 is a cross-sectional view particularly illustrating a resonator structure equipped with oscillators in accordance with the present invention.

FIG. 7 shows in a cross-sectional view another embodiment in which a plurality of solid-state oscillators of the present invention are assembled and operated in parallel or simultaneously. In this figure, a plurality of solid-state oscillators are arranged on a support plate 18 as in FIG. 6 embodiment. A plurality of connectors 19 are provided to the support plate 18 for connection with connection terminals of different solid-state oscillators respectively. A spherical reflector 20 is disposed so as to be one half of a confocal resonator opposing the oscillator assembly. With a bias source connected with the respective connectors, electromagnetic waves having the same plane of polarization are radiated from the slits 11. Also in this embodiment, the planar resonator 4 have a relatively low quality factor and the slits 11 are not resonant at any particular frequency. Therefore, the frequencies of electromagnetic waves radiated from the slits 11 are readily pulled in to the resonance frequency of the confocal resonator with a result that all of the oscillators are synchronized with one another.

With the arrangement illustrated in FIGS. 6 and 7, a sum of high frequency power outputs amounting to a large output may be derived from an output circuit 21 coupled with the spherical reflector 20. Thus, it is possible to obtain a large amount of a high frequency power output with a simplified construction.

The above-described embodiments in which one or more solid-state oscillators of the present invention are used as a high frequency radiation source in the frequency range from microwaves to millimeter waves makes use of the advantageous fact that the oscillators is very easily mountable on an external circuit, can radiate a high frequency electromagnetic wave merely by connection with a bias source, and is readily resonant with a resonance frequency of an external circuit because of the planar resonator having a relatively low quality factor and of a non-resonant slit which is not resonant at any particular frequency.

These advantages enable the oscillators of the present invention to offer various excellent characteristics when they are coupled with other kinds of external circuits.

We claim:

1. A solid-state oscillator for radiating electromagnetic waves in the frequency range from microwaves to millimeter waves comprising:

a solid-state oscillating element and an insulating layer, one terminal face of said element and one surface of said insulating layer being joined with a surface of a conductive substrate respectively;

a terminal layer for connecting a bias source, a first conductive layer means for preventing a high frequency current generated by said element upon the application of a bias voltage supplied by said bias source from flowing toward said terminal layer and a second conductive layer for forming a planar resonator for said high frequency current in combination with said insulating layer, said terminal layer and said conductive layers being joined with the other surface opposite to said surface of said insulating layer respectively and being connected serially;

a third conductive layer for connecting said second conductive layer with the other terminal face opposite to said terminal face of said element; and a small slit in said conductive layer for interrupting said high frequency current flowing therein, radiating electromagnetic waves of high frequency and operating as a radiator, thereby said oscillator having a structure such that said oscillating element, said planar resonator, said means for preventing said high frequency current, said terminal, said radiator and said substrate are unified in one body, and being able to radiate said electromagnetic waves by itself.

2. A solid-state oscillator according to claim 1, wherein said insulating layer is made of a styrene copolymer of a small high frequency loss.

3. A solid-state oscillator according to claim 1, wherein an insulating film of a small high frequency loss is coated on said oscillator to reinforce said layers mechanically and to prevent an ambient atmosphere from polluting said layers.

4. A solid-state oscillator according to claim 3, wherein said insulating film is made of a resin.

5. A solid state oscillator according to claim 1, wherein said first conductive layer is formed in the shape of a zigzag to operate as an inductor.

6. A solid-state oscillator according to claim 1, wherein said first conductive layer is formed in such a manner that an effective width thereof is equal to one half of a wavelength in said insulating layer of said high frequency current to operate as a choke.

7. An oscillating device having a radiation source of electromagnetic waves therein comprising:

a solid state oscillator, said oscillator comprising, a solid state oscillator element and an insulating layer, one terminal face of said element and one surface of said insulating layer being joined with a surface of a conductive substrate respectively, a terminal layer for connecting a bias source, a first conductive layer for preventing a high frequency current generated by said element upon the application of a bias voltage supplied by said bias source from flowing toward said terminal layer and a second conductive layer for forming a planar resonator for said high frequency current in combination with said insulating layer, said terminal layer and said conductive layers being joined with the other surface opposite to said surface of said insulating layer respectively and being connected serially, a third conductive layer for connecting said second conductive layer with the other terminal face opposite to said terminal face of said element, and a small slit in said second conductive layer for interrupting said high frequency current flowing therein, radiating electromagnetic waves of high frequency and operating as a radiator, thereby said oscillator having a structure such that said oscillating element, said planar resonator, said means for preventing said high frequency current, said terminal, said radiator and said substrate are unified in one body, and being able to radiate said electromagnetic waves by itself; and means for mounting said oscillator for directing said electromagnetic waves radiated from said oscillator in a particular direction, thereby said device having a radiation source of electromagnetic waves therein.

8. An oscillating device according to claim 7, wherein said oscillator mounting means includes a wave guide means, said substrate of said oscillator being joined with a wall of said wave guide means, whereby said oscillator is coupled to said wave guide means without any coupling means and said electromagnetic waves radiated from said oscillator may be transmitted through said wave guide means.

9. An oscillating device according to claim 7, wherein said oscillator mounting means includes an electromagnetic horn, said substrate of said oscillator being joined with a wall of said horn, whereby a horn-shaped radiator of electromagnetic waves having a simple and rigid structure may be obtained.

10. An oscillating device according to claim 7, wherein said oscillator mounting means includes a resonator for electromagnetic waves, said resonator having a pair of reflecting means opposite to each other, said reflecting means being equipped with an output means for taking out said electromagnetic waves, and a plurality of said oscillators are arranged on and joined to said reflecting means in such a manner that said oscillators are positioned in the same direction to radiate from the slits thereof electromagnetic waves having the same plane of polarization, whereby electric powers radiated from said oscillators are superposed within said resonator and a large amount of power may be taken out by way of said output means.

11. A solid-state oscillator for radiating electromagnetic waves in the frequency range from microwaves to millimeter waves, comprising:

an electrically conductive substrate;

an electrically insulating plate applied on said conductive substrate suffering from little high frequency loss;

a resonating conductive plate with a small slit formed substantially at its central portion;

a solid-state oscillating element connected between an end portion of said resonating plate and said conductive substrate;

an electrically inductive layer integrally coupled at its one end with another end portion of said resonating plate; and a connection terminal layer integrally connected with the other end of said inductive layer;

said resonating plate, said inductive layer and said connection terminal layer being all applied on said insulating plate;

the connection between said oscillating element and said resonating plate being made through a conductor extending from the first-mentioned end portion of said resonating plate; and the length of said small slit being perpendicular to the direction of flow of a high frequency current to be generated by said oscillating element to interrupt said current and radiate said electromagnetic waves.

* * * * *